(12) United States Patent
Kim et al.

(10) Patent No.: US 7,906,828 B2
(45) Date of Patent: Mar. 15, 2011

(54) HIGH-VOLTAGE INTEGRATED CIRCUIT DEVICE INCLUDING HIGH-VOLTAGE RESISTANT DIODE

(75) Inventors: Sung-lyong Kim, Bucheon-si (KR); Chang-ki Jeon, Gimpso-di (KR)

(73) Assignee: Fairchild Korea Semiconductor, Ltd., Bucheon-si (KR)

( * ) Notice: Subject to any disclaimer, the term of this patent is extended or adjusted under 35 U.S.C. 154(b) by 118 days.

(21) Appl. No.: 12/397,426

(22) Filed: Mar. 4, 2009

(65) Prior Publication Data
US 2009/0166797 A1 Jul. 2, 2009

Related U.S. Application Data

(62) Division of application No. 11/378,210, filed on Mar. 16, 2006, now Pat. No. 7,518,209.

(30) Foreign Application Priority Data

Mar. 16, 2005 (KR) .......................... 10-2005-0021874

(51) Int. Cl.
*H01L 21/70* (2006.01)
(52) U.S. Cl. ........ 257/500; 257/499; 257/502; 257/506; 257/E27.026

(58) Field of Classification Search .................. 257/499, 257/500, 502, 506, E27.026
See application file for complete search history.

(56) References Cited

U.S. PATENT DOCUMENTS

| 4,825,275 | A  | * | 4/1989  | Tomassetti | 257/370 |
|-----------|----|---|---------|------------|---------|
| 5,767,562 | A  | * | 6/1998  | Yamashita  | 257/500 |
| 6,486,512 | B2 | * | 11/2002 | Jeon et al. | 257/339 |
| 6,600,206 | B2 | * | 7/2003  | Jeon et al. | 257/500 |
| 6,995,453 | B2 | * | 2/2006  | Kim et al. | 257/552 |

* cited by examiner

*Primary Examiner* — Andy Huynh
(74) *Attorney, Agent, or Firm* — Thomas R. FitzGerald, Esq.; Hiscock & Barclay, LLP

(57) ABSTRACT

A high-voltage integrated circuit includes a low-voltage circuit region having a plurality of semiconductor devices, which operate with respect to a ground voltage, a high-voltage circuit region having a plurality of semiconductor devices, which operate with respect to a voltage that varies from the ground voltage to a high voltage, a junction termination and a first isolation region electrically isolating the low-voltage circuit region from the high-voltage circuit region, a high-voltage resistant diode formed between the low-voltage circuit region and the high-voltage circuit region, and a second isolation region surrounding the high-voltage resistant diode and electrically isolating the high-voltage resistant diode from the low-voltage circuit region and the high-voltage circuit region.

5 Claims, 5 Drawing Sheets

HIGH-VOLTAGE INTEGRATED CIRCUIT DEVICE INCLUDING HIGH-VOLTAGE RESISTANT DIODE

CROSS-REFERENCE TO RELATED APPLICATIONS

This application is a divisional of U.S. patent application Ser. No. 11/378,210 filed Mar. 16, 2006, which claims the priority of Korean Patent Application No. 2005-0021874, filed on Mar. 16, 2005, in the Korean Intellectual Property Office, the disclosure of which is incorporated herein in its entirety by reference.

FIELD OF THE INVENTION

The present invention relates to a high-voltage integrated circuit device, and more particularly, to a high-voltage integrated circuit device including a high-voltage resistant diode completely electrically isolated from other regions.

DESCRIPTION OF THE RELATED ART

Recently, technology for manufacturing a high-voltage integrated circuit devices including semiconductor devices operating at high voltages and lower voltage or logic circuits driving the semiconductor devices, has been developing rapidly. One example of such technology is shown in U.S. Pat. No. 6,507,085.

FIGS. 1 through 4 are schematic plan views of other conventional high-voltage integrated circuit devices with low voltage circuits. Like reference numerals in FIGS. 1 through 4 denote like elements.

Figure 1:
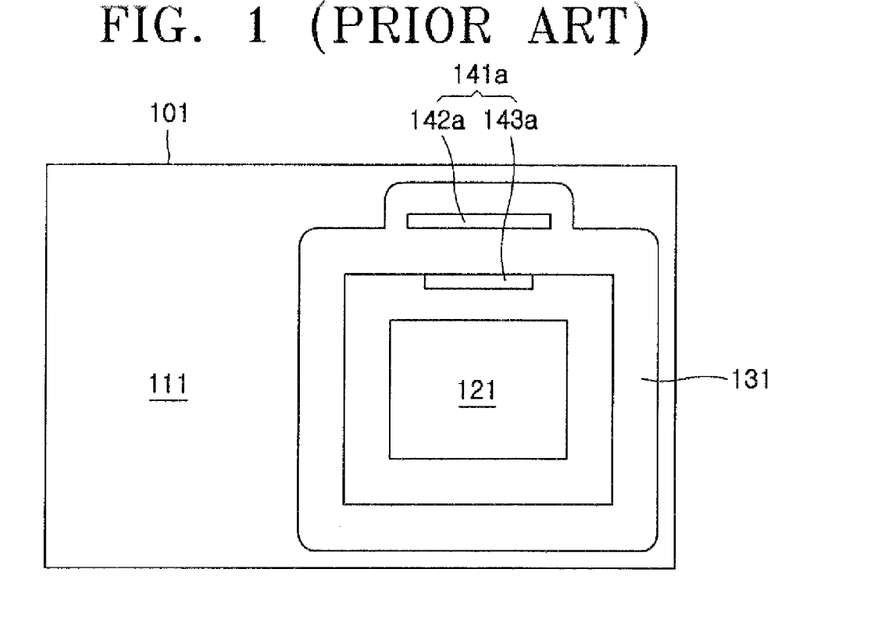
FIGS. 1 through 4 are schematic plan views of conventional high-voltage integrated circuit devices.

Referring to FIG. 1, a conventional high-voltage integrated circuit device 101 includes a low-voltage circuit region 111, a high-voltage circuit region 121, a junction termination 131, and a high-voltage resistant diode 141a.

The junction termination 131 electrically isolates the low-voltage circuit region 111 from the high-voltage circuit region 121. The high-voltage resistant diode 141a is formed in the junction termination 131. The high-voltage resistant diode 141a includes an anode 142a and a cathode 143a. The anode 142a is formed of a p$^+$-type impurity region and the cathode 143a is formed of an n$^+$-type impurity region. Therefore, when a forward voltage is applied between the anode 142a and the cathode 143a, holes released from the anode 142a move to the cathode 143a, and electrons released from the cathode 143a move to the anode 142a, thereby causing electric current to flow from the anode 142a to the cathode 143a.

In this case, even though all of the holes released from the anode 142a should flow into the cathode 143a, some of the holes are drawn into the high-voltage circuit region 121 through the right or left side of the cathode 143a. Since some of the holes released from the anode 142a flow into the high-voltage circuit region 121 as described above, a leakage current flows from the high-voltage resistant diode 141a to the high-voltage circuit region 121, which may cause semiconductor devices (not shown) in the high-voltage circuit region 121 to operate unstably.

Figure 2:
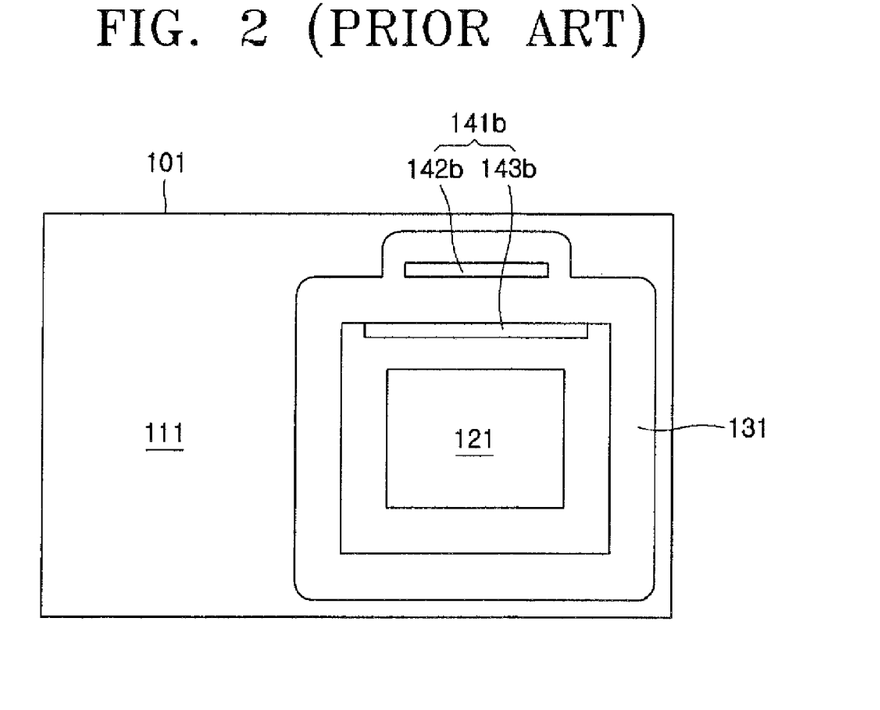
Figure 3:
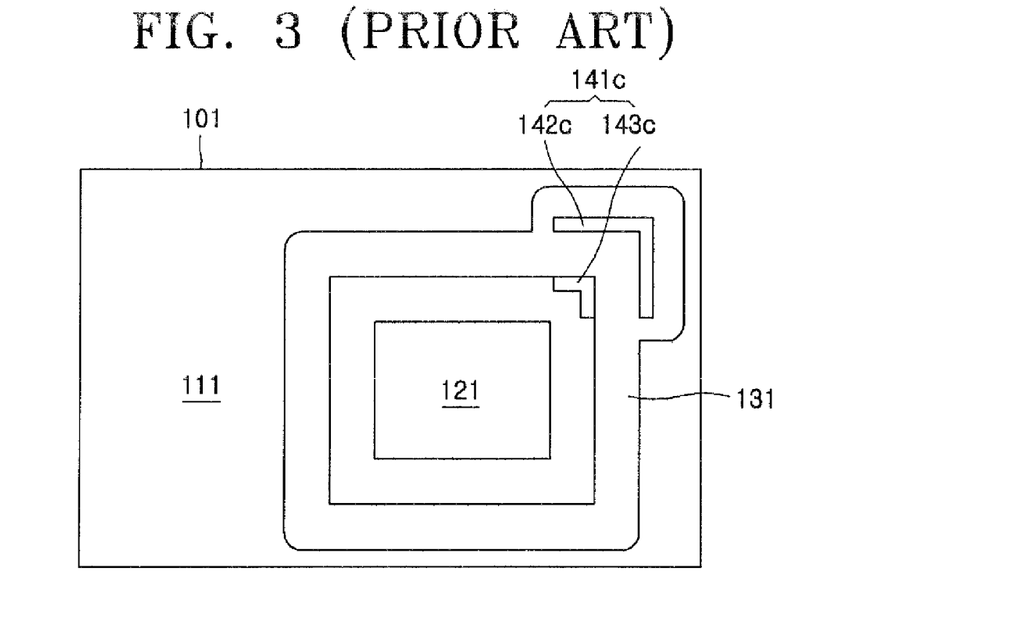
Figure 4:
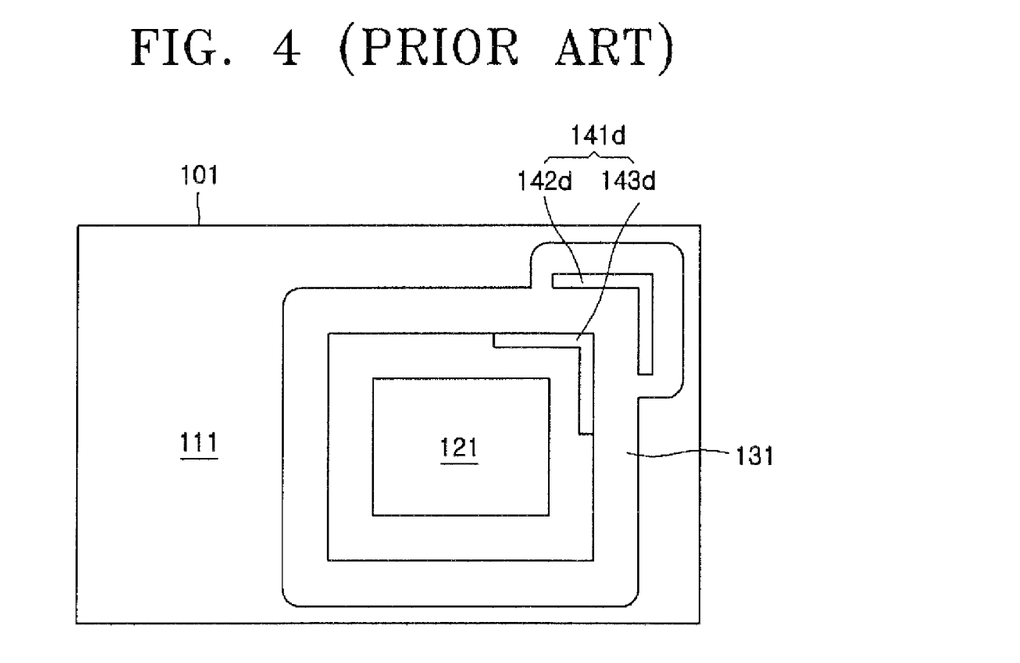

FIGS. 2 through 4 illustrate modified structures of the high-voltage resistant diode 141a illustrated in FIG. 1. Referring to FIGS. 2 through 4, high-voltage resistant diodes 141b through 141d include anodes 142b through 142d and cathodes 143b through 143d, respectively. The high-voltage resistant diodes 141b through 141d are smaller than the high-voltage resistant diode 141a illustrated in FIG. 1 but still have leakage currents. In other words, not all holes released from the anodes 142b through 142d are injected into the cathodes 143b through 143d, respectively. Some of the holes are injected into high-voltage circuit regions 121, thereby causing leakage currents to flow from the high-voltage resistant diodes 141b through 141d to the high-voltage circuit regions 121, respectively. As a result, semiconductor devices formed in the high-voltage circuit regions 121 operate unstably due to the leakage currents.

SUMMARY OF THE INVENTION

The present invention provides a high-voltage integrated circuit device including a high-voltage resistant diode that does not generate a leakage current or otherwise greatly reduces the leakage current to such small amounts that the leakage current does not adversely affect operation of the power devices. According to an aspect of the present invention, there is provided a high-voltage integrated circuit device including: a low-voltage circuit region having a plurality of semiconductor devices, which operate with respect to a ground voltage; a high-voltage circuit region having a plurality of semiconductor devices, which operate with respect to a high voltage source that is typically greater than the ground voltage of the low voltage; a junction termination and a first isolation region electrically isolating the low-voltage circuit region from the high-voltage circuit region; a high-voltage resistant diode formed between the low-voltage circuit region and the high-voltage circuit region; and a second isolation region surrounding the high-voltage resistant diode and electrically isolating the high-voltage resistant diode from the low-voltage circuit region and the high-voltage circuit region.

The second isolation region may overlap the junction termination. The high-voltage resistant diode may a bootstrap diode. The high-voltage resistant diode may include an anode electrode and a cathode electrode and maintain its electrical characteristics when a voltage of 600V or less is applied between the anode electrode and the cathode electrode.

The high-voltage resistant diode may include: a first conductive type substrate; a second conductive type epitaxial layer formed on the substrate; an insulating film formed on the epitaxial layer; a first conductive type well region formed in an upper region of the epitaxial layer; a second conductive type and heavily doped anode region formed in an upper region of the well region; a second conductive type and heavily doped cathode region formed in the upper region of the epitaxial layer to be horizontally separated by a predetermined distance from the anode region; the anode electrode electrically connected to the anode region; and the cathode electrode electrically connected to the cathode region.

The second isolation region may include: a first diffusion region comprising a first conductive type buried layer overlapping the substrate and the epitaxial layer and a first conductive type impurity region formed in and connected to the first conductive type buried layer, and separated by a predetermined distance from the well region; and a second diffusion region comprising another first conductive type buried layer overlapping the substrate and the epitaxial layer and another first conductive type impurity region formed in and connected to the another first conductive type buried layer, and separated by a predetermined distance from the cathode region.

According to another aspect of the present invention, there is provided a high-voltage integrated circuit device including: a low-voltage circuit region having a plurality of semiconductor devices, which operate with respect to a low voltage source, typically ground, a high-voltage circuit region having a plurality of semiconductor devices, which operate with respect to a voltage that is typically substantially greater than the ground; a junction termination and a first isolation region electrically isolating the low-voltage circuit region from the high-voltage circuit region; a high-voltage resistant diode formed between the low-voltage circuit region and the high-voltage circuit region; a second isolation region surrounding the high-voltage resistant diode and electrically isolating the high-voltage resistant diode from the low-voltage circuit region and the high-voltage circuit region; a high-voltage metal oxide semiconductor transistor formed between the low-voltage circuit region and the high-voltage circuit region; and a third isolation region surrounding the high-voltage metal oxide semiconductor transistor to isolate the high-voltage metal oxide semiconductor transistor from the low-voltage circuit region and the high-voltage circuit region and having a portion overlapping the high-voltage metal oxide semiconductor transistor.

The third isolation region may include: a first conductive type substrate; a first conductive type epitaxial layer formed on the substrate; a first diffusion region of a first conductive type, which overlaps the substrate and the epitaxial layer; and a second diffusion region of the first conductive type, which overlaps the substrate and the epitaxial layer and is separated by a predetermined distance from the first diffusion region.

The high-voltage metal oxide semiconductor transistor may include: a first conductive type well region formed in the first diffusion region; a second conductive type and heavily doped source region formed in an upper region of the well region; a first conductive type and heavily doped contact region formed in the upper region of the well region to be adjacent to the source region; a source electrode electrically connected to the source region and the contact region; and a first conductive type top region formed in the epitaxial layer and between the first diffusion region and the second diffusion region; a gate insulating film formed on the top region; a gate electrode formed on the gate insulating film; a second conductive type and heavily doped drain region formed in an upper region of the epitaxial layer and between the top region and the second diffusion region; and a drain electrode electrically connected to the drain region.

The first diffusion region may include: a first conductive buried layer overlapping the substrate and the epitaxial layer; and a first conductive type impurity layer formed on and connected to the first conductive buried layer. The second diffusion region may include: another first conductive type buried layer overlapping the substrate and the epitaxial layer; and another first conductive type impurity layer formed on and connected to the another first conductive type buried layer.

The invention may be used in numerous circuits where power mosfets are controlled by low voltage logic circuits which turn on and off the gates of the power mosfets. Such circuits are often found in motor driver circuits, Class D amplifiers, and DC-DC converters. For example, in a combined gate driver and bridge circuit, the bridge circuit has high side and low side power mosfets and low voltage gate drivers that turn the power mosfets on and off. The bootstrap diode protects the low power logic devices by blocking current from a bootstrap capacitor that is used to operate the power mosfets. The bootstrap diode appears works with the capacitor to not only prevent damaging high voltage/current from reaching the low voltage gate drivers but also allows the capacitor to store the charge for later use by the power mosfets.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth therein; rather, these embodiments are provided so that this disclosure will be thorough and complete, and will fully convey the concept of the invention to those skilled in the art. Like reference numerals in the drawings denote like elements, and thus their description will omitted.

Figure 5:
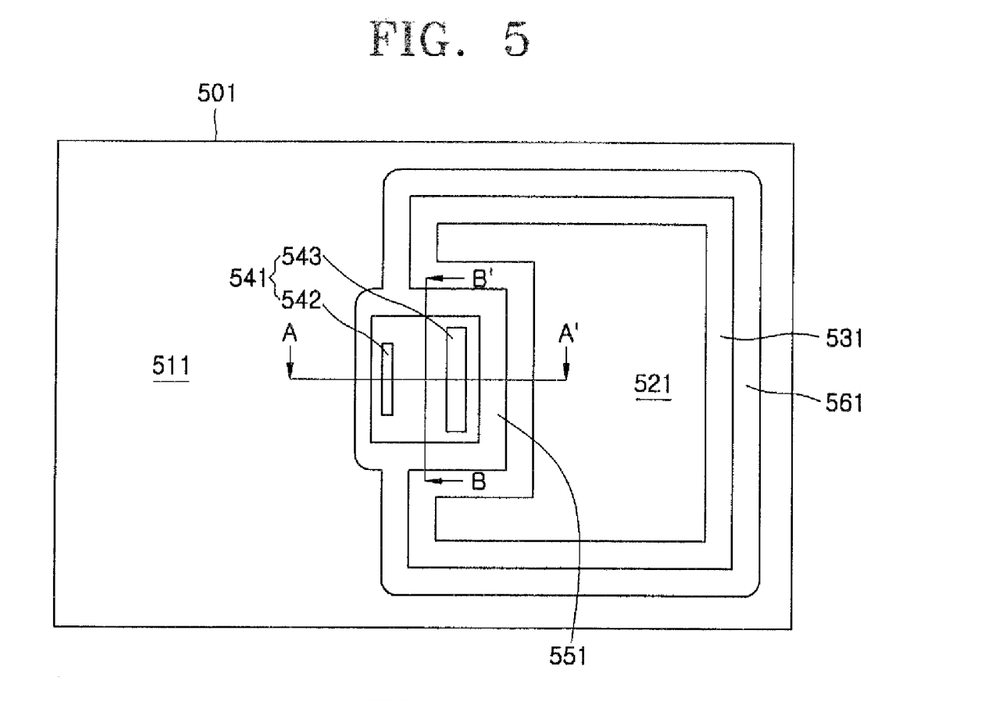
FIG. 5 is a schematic plan view of a high-voltage integrated circuit device according to an embodiment of the present invention.

FIG. 5 is a schematic plan view of a high-voltage integrated circuit device 501 according to an embodiment of the present invention. Referring to FIG. 5, the high-voltage integrated circuit device 501 includes a low-voltage circuit region 511, a high-voltage circuit region 521, a junction termination 531, a high-voltage resistant diode 541, a first isolation region 551, and a second isolation region 561. Those skilled in the art understand that the edges of power semiconductors often experience increased electrical fields. The edges are typically terminated by structures that reduce or modify the affect of the increased electrical fields and a junction termination is a typical structure that achieves this purpose.

The low-voltage circuit region 511 includes a plurality of semiconductor devices (not shown) with a low voltage source that provides operating voltages of 30V or less with respect to ground voltage of 0V. The high-voltage circuit region 521 includes a plurality of semiconductor devices (not shown) with operating voltages between 600 and 0 volts.

The junction termination 531 and the second isolation region 561 electrically isolate the low-voltage circuit region 511 from the high-voltage circuit region 521. If a high voltage is applied to the low-voltage circuit region 511, the semiconductor devices formed in the low-voltage circuit region 511 will be destroyed and thus rendered unable to operate. To prevent this problem, the low-voltage circuit region 511 is completely electrically isolated from the high-voltage circuit region 521 by the junction termination 531 and the second isolation region 561.

The high-voltage resistant diode 541 is resistant to a high reverse voltage of, for example, 600V or less. In other words, even when a high voltage of 600V is applied between the cathode 543 and the anode 542 of the high-voltage resistant diode 541, the high-voltage resistant diode 541 is not destroyed and operates normally while maintaining its original electrical characteristics.

The high-voltage resistant diode 541 includes a bootstrap diode and is formed in the junction termination 531. By being surrounded by the first isolation region 551, the high-voltage resistant diode 541 is completely electrically isolated from the high-voltage circuit region 521 and the low-voltage circuit region 511. Hence, electric current flowing through the high-voltage resistant diode 541 does not affect the semiconductor devices in the high-voltage circuit region 521 or those in the low-voltage circuit region 511 at all.

Figure 6:
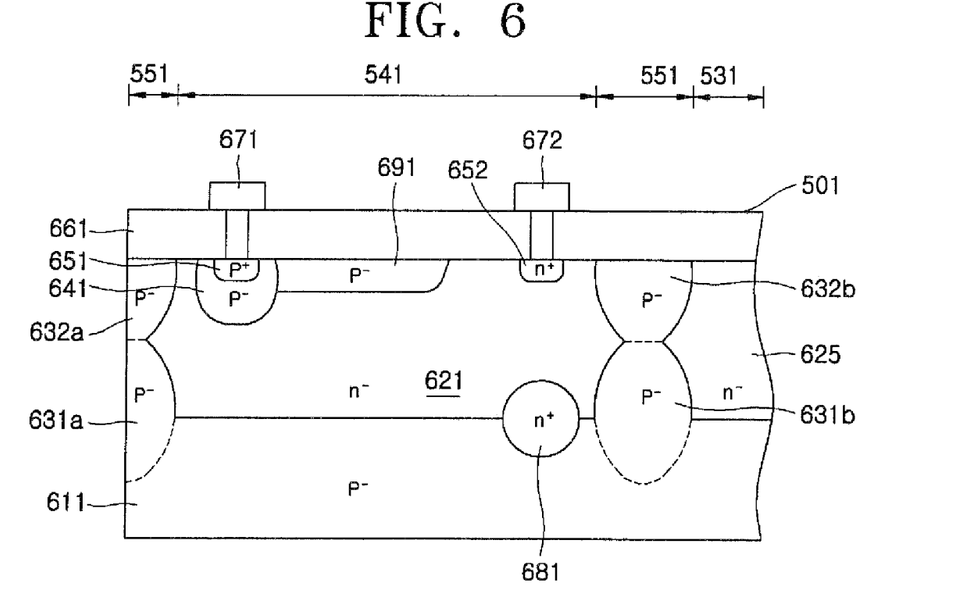
FIG. 6 is a schematic cross-sectional view of the high-voltage integrated circuit device taken along line A-A' of FIG. 5 to describe the structures of a high-voltage resistant diode and a first isolation region illustrated in FIG. 5.

FIG. 6 is a schematic cross-sectional view of the high-voltage integrated circuit device 501 taken along line A-A' of FIG. 5 to describe the structures of the high-voltage resistant diode 541 and the first isolation region 551 illustrated in FIG. 5.

Referring to FIG. 6, the high-voltage resistant diode 541 includes a semiconductor substrate 611, an epitaxial layer 621, a buried layer 681, a well region 641, a top region 691, an anode region 651, an anode electrode 671, a cathode region 652, a cathode electrode 672, and an insulating film 661.

Referring to FIG. 6, the first isolation region 551 includes a lightly doped p-type first diffusion region and a lightly doped p-type second diffusion region. The first and second diffusion regions respectively include buried layers 631a and 631b and impurity regions 632a and 632b, which are vertically adjacent to each other. The four regions 631A, 631b, 632a, 632b are horizontally next to each other in all regions.

The epitaxial layer 621, which is lightly doped with n-type material is electrically isolated from the high-voltage circuit region 521 of FIG. 5 by the first and second diffusion regions.

Specifically, the lightly doped n-type epitaxial layer 621 is formed on the semiconductor substrate 611, which is lightly doped with p-type dopants. The first diffusion region and the second diffusion region are formed on the left and right sides of the diode 541 in the epitaxial layer 621. The well region 641 and the top region 691, which are both lightly doped with p-type dopants, are formed in an upper part of the epitaxial layer 621. The anode region 651, which is heavily doped with p-type dopants, is formed on a top surface of the well region 641. The top surface of the epitaxial layer has an insulating layer 661 with vias for electrodes. The anode electrode 671 is formed on the insulating film 661 and extends through a via to contact the anode region 651. The buried layer 681 is heavily doped with n-type dopants. The cathode region 652, which is heavily doped with n-type dopants, is formed on a surface of the epitaxial layer 621 and is vertically separated by a predetermined distance from the buried layer 681. The cathode electrode 672 is formed on the insulating film 661, and the cathode electrode 672 extends through a via to contact the cathode region 652.

Figure 7:
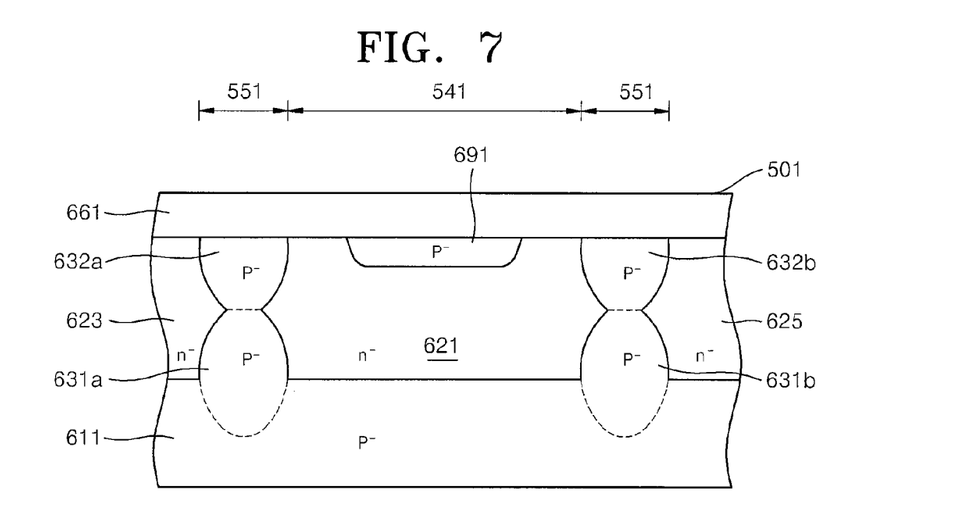
FIG. 7 is a schematic cross-sectional view of the high-voltage integrated circuit device taken along line B-B' of FIG. 5 to additionally describe the structure of the high-voltage resistant diode illustrated in FIG. 5.

The second isolation region 561 of FIG. 5 has the same structure as the first isolation region 551 that includes a buried layer 631a and an impurity region 632a which are vertically adjacent. FIG. 7 is a schematic cross-sectional view of the high-voltage integrated circuit device 501 taken along line B-B' of FIG. 5 to additionally describe the structure of the high-voltage resistant diode 541 illustrated in FIG. 5.

Referring to FIG. 7, the high-voltage resistant diode 541 includes the lightly doped p-type semiconductor substrate 611, the lightly doped n-type epitaxial layer 621, the lightly doped p-type top region 691, and the insulating film 661.

Referring to FIG. 7, the first isolation region 551 includes the lightly doped p-type first diffusion region and the lightly doped p-type second diffusion region. The first and second diffusion regions respectively include the buried layers 631a and 631b and the impurity regions 632a and 632b, which are vertically adjacent to each other. The epitaxial layer 621 is electrically isolated from a drift layer 623 on its left side and the drift layer 625 on its right side by the first and second diffusion regions.

Figure 8:
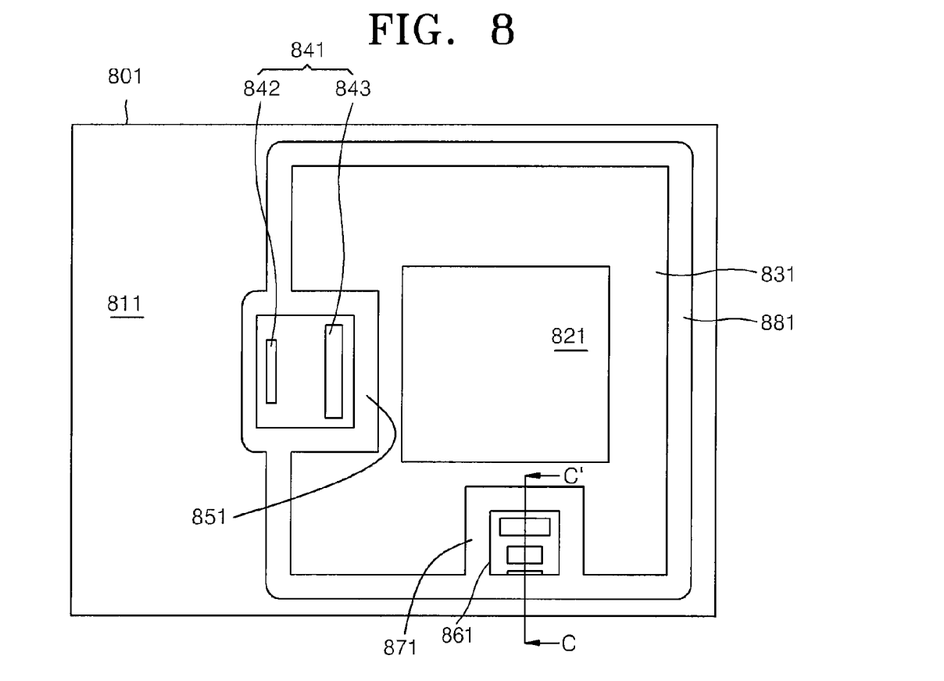
FIG. 8 is a schematic plan view of a high-voltage integrated circuit device according to another embodiment of the present invention.

FIG. 8 is a schematic plan view of a high-voltage integrated circuit device 801 according to another embodiment of the present invention. Referring to FIG. 8, the high-voltage integrated circuit device 801 includes a low-voltage circuit region 811, a high-voltage circuit region 821, a junction termination 831, a high-voltage resistant diode 841, a high-voltage metal oxide semiconductor (MOS) transistor 861, a first isolation region 881, a second isolation region 851, and a third isolation region 871.

The low-voltage circuit region 811 includes a plurality of semiconductor devices (not shown) with operating voltages of 30V or less with respect to ground. The high-voltage circuit region 821 includes a plurality of semiconductor devices (not shown) with operating voltages of between 0V-600V.

The junction termination 831 and the first isolation region 881 electrically isolate the low-voltage circuit region 811 from the high-voltage circuit region 821. If a high voltage is applied to the low-voltage circuit region 811, the semiconductor devices formed in the low-voltage circuit region 811 are destroyed and thus rendered unable to operate. To prevent this problem, the low-voltage circuit region 811 is completely electrically isolated from the high-voltage circuit region 821 by the junction termination 831 and the first isolation region 881.

By being surrounded by the second isolation region 851, the high-voltage resistant diode 841 is completely electrically isolated from the low-voltage circuit region 811, the high-voltage circuit region 821, and the high-voltage MOS transistor 861. Hence, electric current flowing through the high-voltage resistant diode 841 does not affect the semiconductor devices in the low-voltage circuit region 811, those in the high-voltage circuit region 821, and the high-voltage MOS transistor 861 at all.

As described above, since the high-voltage resistant diode 841 is completely electrically isolated by the second isolation region 851, even though the high-voltage MOS transistor 861 is formed in the vicinity of the high-voltage circuit region 821, the high-voltage MOS transistor 861 can operate normally without being affected by the high-voltage resistant diode 841.

The high-voltage MOS transistor 861 is surrounded by the third isolation region 871 and thus completely isolated from the low-voltage circuit region 811, the high-voltage circuit region 821, and the high-voltage resistant diode 841. Thus, the high-voltage MOS transistor 861 can be formed in the vicinity of the high-voltage circuit region 821. Since the high-voltage MOS transistor 861 is formed in the vicinity of the high-voltage circuit region 821, the high-voltage MOS transistor 861 can be easily electrically connected to the high-voltage circuit region 821.

In addition, since the high-voltage MOS transistor 861 is formed in the vicinity of the high-voltage circuit region 821, the size of a circuit including the high-voltage MOS transistor 861 and the high-voltage circuit region 821 is reduced, resulting in a reduction in the size of the high-voltage integrated circuit device 801. There may be more than one high-voltage MOS transistor 861.

The structure of the high-voltage resistant diode 841 is identical to those in FIGS. 6 and 7 and thus its description will be omitted.

Figure 9:
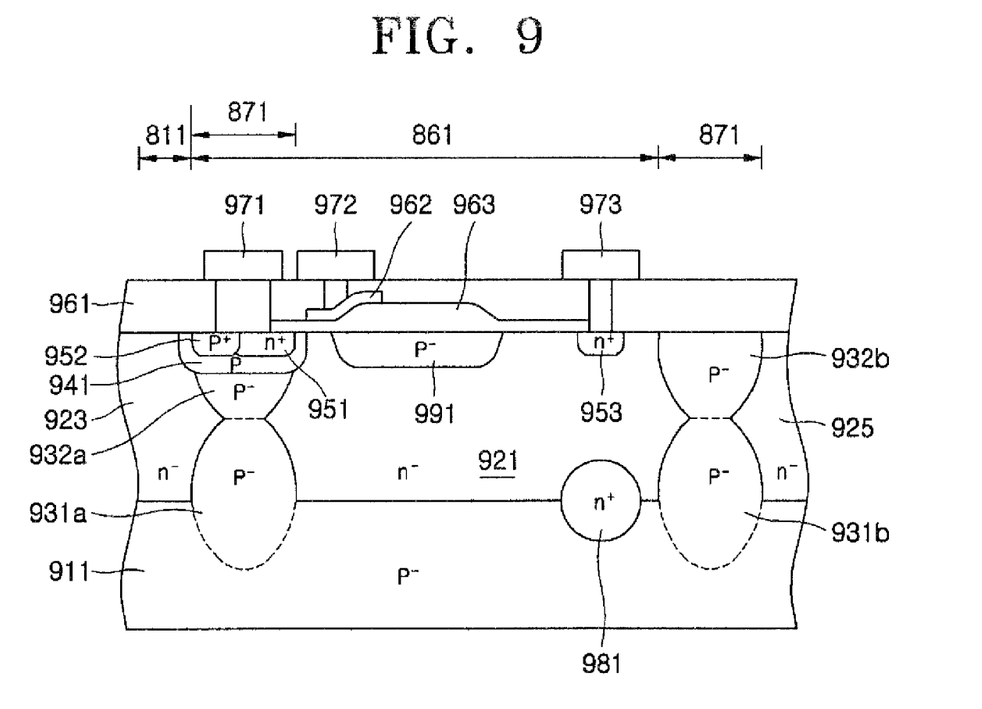
FIG. 9 is a schematic cross-sectional view of the high-voltage integrated circuit device taken along line C-C' of FIG. 8 to describe the structures of a high-voltage metal oxide semiconductor (MOS) transistor and a third isolation region illustrated in FIG. 8.

FIG. 9 is a schematic cross-sectional view of the high-voltage integrated circuit device 801 taken along line C-C' of FIG. 8 to describe the structures of the high-voltage MOS transistor 861 and the third isolation region 871 illustrated in FIG. 8.

Referring to FIG. 9, the high-voltage MOS transistor 861 includes a semiconductor substrate 911, an epitaxial layer 921, a first diffusion region 931*a* and 932*a*, a well region 941, a contact region 952, a source region 951, a source electrode 971, a buried region 981, a top region 991, an insulating film 961, a gate insulating film 963, gate electrodes 962 and 972, a drain region 953, and a drain electrode 973.

Referring to FIG. 9, the third isolation region 871 includes the first diffusion region 931*a* and 932*a* and the second diffusion region 931*b* and 932*b*. The first diffusion region 931*a* and 932*a* includes a lightly doped p-type buried layer 931*a* and an impurity region 932*a*, which are vertically adjacent to each other. The second diffusion region 931*b* and 932*b* includes a lightly doped p-type buried layer 931*b* and an impurity region 932*b*, which are vertically adjacent to each other. The epitaxial layer 921, which is lightly doped with n-type dopants, is electrically isolated from a drift layer 923 in the low-voltage circuit region 811 and a drift layer 925 by the first and second diffusion regions.

Specifically, the lightly doped n-type epitaxial layer 921 is formed on the semiconductor substrate 911, which is lightly doped with p-type dopants. The first and second diffusion regions overlap the epitaxial layer 921 and the semiconductor substrate 911 and are separated from each other. The p-type well region 941 is formed in the first diffusion region. The contact region 952 and the source region 951, which are heavily doped with p-type and n-type dopants, respectively, are formed in an upper surface of the well region 941.

The drain region 953, which is heavily doped with n-type dopants, is formed in a surface of the epitaxial layer 921 and is separated by a predetermined distance from the buried layer 981. The drain electrode 973 is formed on the insulating film 961 and contacts the heavily doped n-type drain region 953. The top region 991, which is lightly doped with p-type dopants, is formed on the top surface of the epitaxial layer 921. The gate insulating film 963 is formed in the top region 991, and the gate electrodes 962 and 972 are formed on the gate insulating film 963. The gate electrode 962 is insulated from the top region 991 by the gate insulating film 963.

Figure 10:
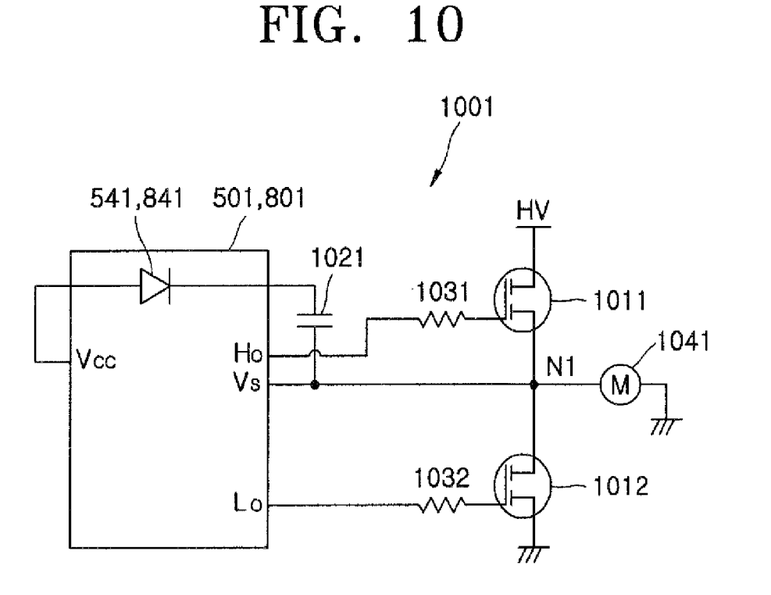
FIG. 10 is a circuit diagram of a high-voltage switching circuit using the high-voltage integrated circuit device of FIG. 5 or 8 according to an embodiment of the present invention.

FIG. 10 is a circuit diagram of a high-voltage switching circuit 1001 using the high-voltage integrated circuit device 501 of FIG. 5 or 801 of FIG. 8 according to an embodiment of the present invention. Referring to FIG. 10, the high-voltage switching circuit 1001 includes the high-voltage integrated circuit device 501 or 801, an upper high-voltage MOS transistor 1011, a lower high-voltage MOS transistor 1012, a capacitor 1021, and resistors 1031 and 1032. The high-voltage resistant diode 541 or 841 is included in the high-voltage integrated circuit device 501 or 801. The high-voltage MOS transistors 1011 and 1012 may be included in the high-voltage integrated circuit device 501 or 801 as illustrated in FIG. 8.

The ground voltage of 0 volts is applied to the semiconductor devices in the low voltage region. The substrate voltage Vs varies from 0 volts to 600 volts according to the on or off state of the upper high voltage MOS transistor 1011 and is applied to the semiconductor devices in the high voltage circuit region. Thus, 0-600 volts are applied to the drain of the upper high voltage MOS transistor 1011 as a HV. When the HV is 600 volts and the upper high voltage MOS transistor turns on, the substrate voltage becomes 600 volts. If HV is 0 volts and the upper high voltage MOS transistor turns on, the substrate voltage becomes 0 volts.

When a voltage output from a terminal HO of the high-voltage integrated circuit device 501 or 801 is applied across the resistor 1031, the upper high-voltage MOS transistor 1011 is activated. Then, a high voltage HV is supplied to a motor 1041, through the high-voltage MOS transistor 1011, thereby causing the motor 1041 to rotate.

When a voltage output from a terminal LO of the high-voltage integrated circuit device 501 or 801 is applied across the resistor 1032, the lower high-voltage MOS transistor 1012 is activated. Then, the voltage of a node N1 becomes equal to a lower (ground) voltage (0V), thereby stopping the rotation of the motor 1041.

Here, the voltage of the node N1 may be set very high to, for example, 600V or less. When the lower high-voltage MOS transistor 1012 is activated, a supply voltage Vcc is supplied to the capacitor 1021 through the forward biased high-voltage resistant diode 541 or 841. Then, the capacitor 1021 is charged and the semiconductor devices in the high-voltage circuit region 521 of FIG. 5 or 821 of FIG. 8 operate using this charged voltage. When the lower high-voltage MOS transistor 1012 is deactivated and the upper high-voltage MOS transistor 1011 is activated, the high voltage HV of 600V or less is applied to the node N1.

Therefore, without the high-voltage resistant diode 541 or 841, the high voltage HV of 600V or less could be directly applied to the supply voltage terminal Vcc and that high voltage would destroy the low-voltage circuit region 511 of FIG. 5 or 811 of FIG. 8. To prevent this problem, the high-voltage resistant diode 541 or 841 is connected between the capacitor 1021 and the high-voltage integrated circuit device 501 or 801 and thus blocks the high voltage HV, thereby protecting the low-voltage circuit region 511 of FIG. 5 or 811 of FIG. 8. Any hole current that leaks from the reverse biased diode 541,841 is prevented from reaching the high or low voltage devices by the isolation regions that are on opposite sides of the diode.

As described above, a high-voltage resistant diode is implemented in a high-voltage integrated circuit device according to the present invention. Therefore, circuit configuration is simplified and circuit manufacturing costs are reduced.

In addition, since the high-voltage resistant diode included in the high-voltage integrated circuit device is completely electrically isolated from a low-voltage circuit region and a high-voltage circuit region by isolation regions, a leakage current does not flow from the high-voltage resistant diode to the high-voltage circuit region. Hence, semiconductor devices formed in the high-voltage circuit region can operate normally.

Also, since the high-voltage resistant diode is completely electrically isolated from the low-voltage circuit region and the high-voltage circuit region by a second isolation region, the high-voltage MOS transistor can be included in a junction termination. Hence, the size of a circuit including the high-voltage resistant diode, the high-voltage MOS transistor, and the high-voltage circuit region is reduced, resulting in a reduction in the overall size of the high-voltage integrated circuit device. Consequently, manufacturing costs of the high-voltage integrated circuit device are reduced.

Optimum embodiments are disclosed in the drawings and the specification. In this disclosure, a p type conductor may be expressed as a first conductive type and an n type conductor may be expressed as a second conductive type, and vice versa.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A high-voltage integrated circuit device comprising:
   a low-voltage circuit region having a plurality of semiconductor devices, which operate with respect to a ground voltage;
   a high-voltage circuit region having a plurality of semiconductor devices, which operate with respect to a voltage that varies from the ground voltage to a high voltage;
   a junction termination and a first isolation region electrically isolating the low-voltage circuit region from the high-voltage circuit region;
   a high-voltage resistant diode formed between the low-voltage circuit region and the high-voltage circuit region;
   a second isolation region surrounding the high-voltage resistant diode and electrically isolating the high-voltage resistant diode from the low-voltage circuit region and the high-voltage circuit region;
   a high-voltage metal oxide semiconductor transistor formed between the low-voltage circuit region and the high-voltage circuit region; and
   a third isolation region surrounding the high-voltage metal oxide semiconductor transistor to isolate the high-voltage metal oxide semiconductor transistor from the low-voltage circuit region and the high-voltage circuit region and having a portion overlapping the high-voltage metal oxide semiconductor transistor.

2. The device of claim 1, wherein the third isolation region comprises:
   a first conductive type substrate;
   a first conductive type epitaxial layer formed on the substrate;
   a first diffusion region of a first conductive type, which overlaps the substrate and the epitaxial layer; and
   a second diffusion region of the first conductive type, which overlaps the substrate and the epitaxial layer and is separated by a predetermined distance from the first diffusion region.

3. The device of claim 1, wherein the high-voltage metal oxide semiconductor transistor comprises:
   a first conductive type well region formed in the first diffusion region;
   a second conductive type and heavily doped source region formed in an upper region of the well region;
   a first conductive type and heavily doped contact region formed in the upper region of the well region to be adjacent to the source region;
   a source electrode electrically connected to the source region and the contact region; and
   a first conductive type top region formed in the epitaxial layer and between the first diffusion region and the second diffusion region;
   a gate insulating film formed on the top region;
   a gate electrode formed on the gate insulating film;
   a second conductive type and heavily doped drain region formed in an upper region of the epitaxial layer and between the top region and the second diffusion region; and
   a drain electrode electrically connected to the drain region.

4. The device of claim 2, wherein the first diffusion region comprises:
   a first conductive buried layer overlapping the substrate and the epitaxial layer; and
   a first conductive type impurity layer formed on and connected to the first conductive buried layer.

5. The device of claim 2, wherein the second diffusion region comprises:
   another first conductive type buried layer overlapping the substrate and the epitaxial layer; and
   another first conductive type impurity layer formed on and connected to the another first conductive type buried layer.

* * * * *